(12) United States Patent
Wu et al.

(10) Patent No.: US 8,471,324 B2
(45) Date of Patent: Jun. 25, 2013

(54) SEMICONDUCTOR DEVICE (75) Inventors: Tin-Wei Wu, Hsinchu (TW);
Cheng-Ming Yih, Hsinchu (TW);
Chih-Hsiang Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 782 days.

(21) Appl. No.: 12/559,781

(22) Filed: Sep. 15, 2009

(65) Prior Publication Data
US 2011/0062507 A1    Mar. 17, 2011

(51) Int. Cl.
*H01L 29/788* (2006.01)
(52) U.S. Cl.
USPC ........... 257/316; 257/315; 257/326; 257/503; 257/E29.3
(58) Field of Classification Search
USPC .. 257/326, 390, 503, 903, E21.683–E21.691, 257/316, E29.3
See application file for complete search history.

(56) References Cited

U.S. PATENT DOCUMENTS

| 5,905,293 | A | 5/1999 | Jeng et al. |
| 6,251,764 | B1 | 6/2001 | Pradeep et al. |
| 7,332,766 | B2 * | 2/2008 | Hasegawa et al. ............ 257/315 |
| 2008/0067573 | A1 * | 3/2008 | Jang et al. .................... 257/315 |
| 2008/0157160 | A1 * | 7/2008 | Chan ............................. 257/315 |

FOREIGN PATENT DOCUMENTS

CN    1677678    10/2005

OTHER PUBLICATIONS

Electronic Translation of CN 1677678 A.*
"First Office Action of China Counterpart Application", issued on Feb. 29, 2012, p. 1-3.

* cited by examiner

*Primary Examiner* — Jose R Diaz
(74) *Attorney, Agent, or Firm* — J.C. Patents (57) ABSTRACT

A semiconductor device is provided. The semiconductor device includes a memory device, and the memory device includes a substrate, two stacked gates, two spacers, an insulating layer, and a dielectric layer. The stacked gates having a gap therebetween are located on the substrate. The spacers having a pipe or a seam therebetween are respectively located at sidewalls of each of the stacked gates in the gap. The pipe or the seam is filled with the insulating layer. The dielectric layer is located on the substrate and covers the insulating layer and the stacked gates.

16 Claims, 6 Drawing Sheets

SEMICONDUCTOR DEVICE

BACKGROUND OF THE INVENTION

1. Field of the Invention

The present invention relates to an integrated circuit and a method of fabricating the same, and more particularly, to a semiconductor device and a method of fabricating the same.

2. Description of Related Art

Memory, so to speak, is a semiconductor device for storing data or information. Among various memory products, a non-volatile memory is characterized by storing, reading, or erasing data repeatedly without loss of data after termination of power supply. Hence, the non-volatile memory has become the semiconductor device extensively applied in personal computers or electronic equipment. In a variety of non-volatile memories, a flash memory possesses advantages of high-speed reading and writing capacity, high memory storage density, and so on. Therefore, the flash memory is applied to communication industry, consumer electronics industry, data processing industry, transportation industry, and so forth.

The flash memory device typically has a stacked gate structure. To comply with requirements for light-weight, slimness, and compactness, a way to reduce the dimension of the flash memory, to increase the memory storage density, and to lower down manufacturing costs has become one of the main research topics in current manufacturing technology. Nonetheless, an aspect ratio of gaps among the stacked gate structures is increased after line width and the pitch are both shortened. Thereby, the gaps among the stacked gate structures cannot be completely filled with a dielectric layer, and pipes or seams are then formed therein. Despite a reflow process performed after formation of the dielectric layer, the temperature at which the reflow process is performed is required to be under certain degrees so as to prevent performance of devices from being affected by the excessively high temperature. As a result, subject to the temperature at which the reflow process is performed, the pipes or the seams can still not be completely filled with the dielectric layer during implementation of the reflow process. As such, the pipes or the seams are filled with metal deposited in a subsequent process of forming a contact window, thus resulting in short circuit between adjacent contact windows.

SUMMARY OF THE INVENTION

The present invention is directed to a semiconductor device in which no gaps exist among stacked gate structures.

In the present invention, a semiconductor device including a substrate, a plurality of stacked gates, a first doped region, a second doped region, a spacer material layer, two spacers, an insulating layer, and a dielectric layer is provided. The stacked gates are located on the substrate, and there are a first gap and a second gap among the stacked gates. A dimension of the first gap is smaller than a dimension of the second gap. The first doped region is located in the substrate under the first gap. The second doped region is located in the substrate under the first gap. The spacer material layer is located in the first gap. The two first spacers are located at sidewalls of two adjacent stacked gates in the second gap. A material of the first spacers is the same as a material of the spacer material layer. The insulating layer is filled up a pipe or a seam between the two first spacers. The dielectric layer is located on the substrate and covers the insulating layer and the stacked gates.

According to an embodiment of the present invention, the semiconductor device further includes a contact window located in the dielectric layer, the insulating layer, and the first spacers in the second gap. The contact window is electrically connected to the second doped region.

According to an embodiment of the present invention, the contact window directly contacts the second doped region.

According to an embodiment of the present invention, the semiconductor device further includes a silicide layer located merely between the contact window and the second doped region.

According to an embodiment of the present invention, each of the stacked gates further includes a self-aligned silicide layer, and a material of the self-aligned silicide layer is different from a material of the silicide layer.

According to an embodiment of the present invention, the self-aligned silicide layer is not formed on the first doped region and the second doped region.

According to an embodiment of the present invention, each of the stacked gates, from bottom to top, includes a tunneling dielectric layer, a floating gate, an inter-gate dielectric layer, and a control gate.

According to an embodiment of the present invention, the substrate includes a memory cell region and a first logic circuit region. The stacked gates are located in the memory cell region, and the semiconductor device further includes a first transistor and two second spacers. The first transistor is located on the first logic circuit region. The two second spacers are located at sidewalls of a first gate of the first transistor, and a material of the second spacers is the same as a material of the insulating layer.

According to an embodiment of the present invention, the first transistor further includes two first extended source or drain regions, two first source or drain regions, and a plurality of self-aligned silicide layers. The two first extended source or drain regions are located in the substrate under the second spacers. The two first source or drain regions are located in the substrate and electrically connected to the first extended source or drain regions. The self-aligned silicide layers are located on the first source or drain regions and the first gate of the first transistor.

According to an embodiment of the present invention, the substrate further includes a second logic circuit region, and the semiconductor device further includes a second transistor, two third spacers, and two fourth spacers. The second transistor is located on the second logic circuit region. The two third spacers are located at sidewalls of a second gate of the second transistor, and a material of the third spacers is the same as the material of the spacer material layer. The two fourth spacers surround the third spacers, and a material of the fourth spacers is the same as the material of the insulating layer.

According to an embodiment of the present invention, the first transistor includes two first extended source or drain regions located in the substrate under the second spacers. The second transistor includes two second extended source or drain regions located in the substrate under the third spacers and the fourth spacers. A width of the second extended source or drain regions is greater than a width of the first extended source or drain regions.

According to an embodiment of the present invention, the semiconductor device further includes a plurality of first self-aligned silicide layers and a plurality of second self-aligned silicide layers. The first self-aligned silicide layers are located on the first gate and the two first source or drain regions of the first transistor. The second self-aligned silicide layers are located on the second gate and the two second source or drain regions of the second transistor.

According to an embodiment of the present invention, the substrate includes a memory cell region and a logic circuit region, the stacked gates are located in the memory cell region and the semiconductor device further includes a transistor, two second spacers, and two third spacers. The transistor is located on the logic circuit region. The two second spacers are located at sidewalls of a gate of the transistor, and a material of the second spacers is the same as the material of the spacer material layer. The two third spacers surround the second spacers of the transistor, and a material of the third spacers is the same as a material of the insulating layer.

According to an embodiment of the present invention, the transistor includes two extended source or drain regions, two source or drain regions, and a plurality of self-aligned silicide layers. The two extended source or drain regions are located in the substrate under the second spacers and the third spacers. The two source or drain regions are located in the substrate and electrically connected to the extended source or drain regions. The self-aligned silicide layers are located on the gate and the source or drain regions of the transistor.

According to an embodiment of the present invention, the semiconductor device further includes an etching stop layer located between the dielectric layer and the substrate, the stacked gates, and the insulating layer.

According to an embodiment of the present invention, the semiconductor device further includes a liner located between the stacked gates and the spacer material layer and between the stacked gates and the first spacers.

A memory device including a substrate, two stacked gates, two spacers, an insulating layer, and a dielectric layer is further provided herein. The two stacked gates having a gap therebetween are located on the substrate. The two spacers having a pipe or a seam therebetween are respectively located at sidewalls of the stacked gates in the gap. The pipe or the seam is filled with the insulating layer. The dielectric layer is located on the substrate and covers the insulating layer and the stacked gates.

According to an embodiment of the present invention, each of the stacked gates, from bottom to top, includes a tunneling dielectric layer, a floating gate, an inter-gate dielectric layer, and a control gate.

According to an embodiment of the present invention, each of the stacked gates further comprises a self-aligned silicide layer located on the control gate, and the self-aligned silicide layer not formed on a surface of the substrate between the stacked gates.

According to an embodiment of the present invention, each of the stacked gates further comprises a doped region in the substrate under the spacers and the insulating layer.

According to an embodiment of the present invention, the memory device further includes a contact window located in the dielectric layer, the insulating layer, and the spacers in the gap, wherein the contact window is electrically connected to the second doped region.

According to an embodiment of the present invention, the contact window directly contacts the doped region.

According to an embodiment of the present invention, the memory device further includes a silicide layer located merely between the contact window and the doped region, and a material of the self-aligned silicide layer is different from a material of the silicide layer.

Based on the above, there are no pipes or seams among the stacked gate structures of the semiconductor device according to the present invention, and therefore short circuit of the contact window can be precluded.

In order to make the aforementioned and other features and advantages of the present invention more comprehensible, several embodiments accompanying figures are described in detail below.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention.

DESCRIPTION OF EMBODIMENTS

In the following descriptions, wordings including "up," "over," and "under" serve to indicate reference directions in accompanying figures but not to limit the scope of the present invention. Besides, the word "a" means "at least one" in this disclosure.

FIGS. 1A through 1F are schematic cross-sectional flowcharts illustrating a method of fabricating a semiconductor device according to an embodiment of the present invention.

Figure 1A:
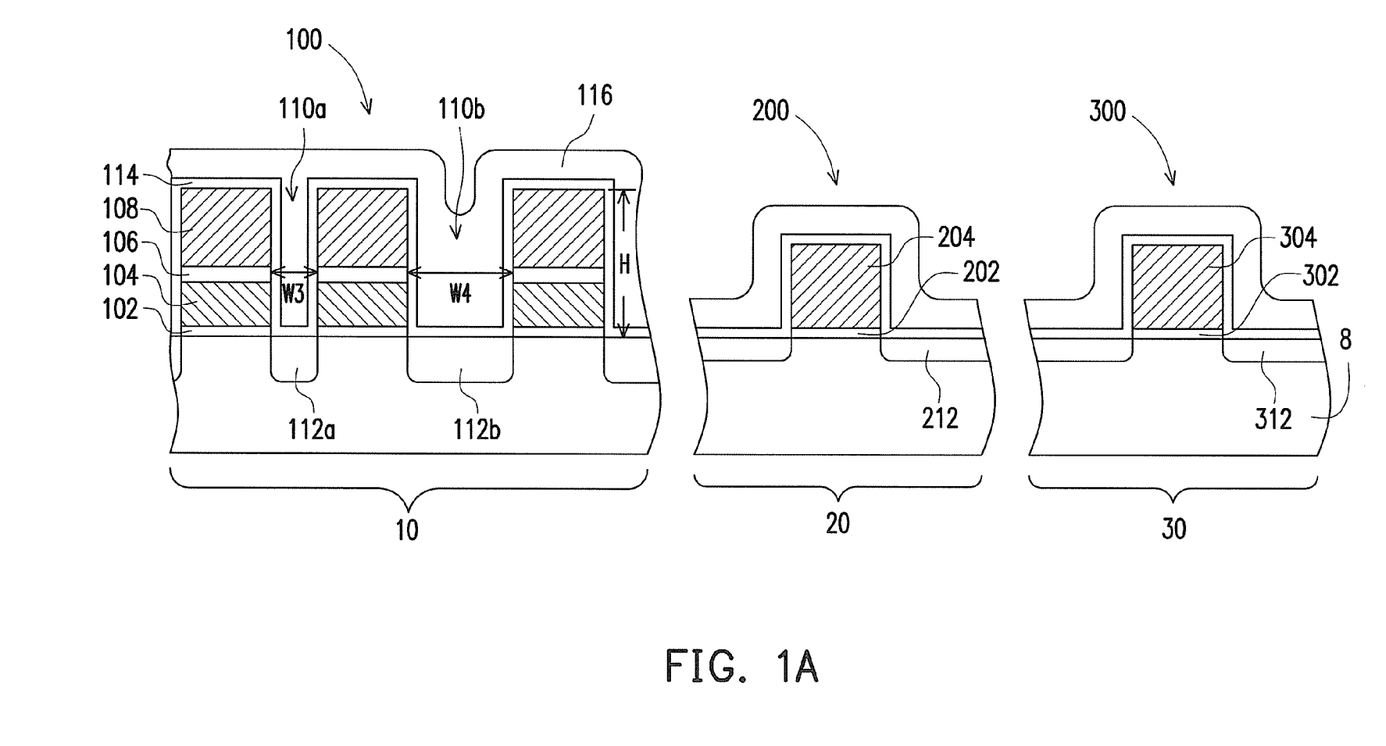
FIGS. 1A through 1F are schematic cross-sectional flowcharts illustrating a method of fabricating a semiconductor device according to an embodiment of the present invention.

Referring to FIG. 1A, a substrate 8 is provided. The substrate 8 is, for example, a semiconductor substrate, such as a silicon substrate, a SiGe substrate, or any other appropriate substrate. The substrate 8 includes a first region 10, a second region 20, and a third region 30. In an embodiment, the first region 10 is, for example, a memory cell region, the second region 20 is a first logic circuit region for forming a low voltage device, and the third region 30 is a second logic circuit region for forming a high voltage device.

A plurality of stacked gates 100 are formed on the substrate 8 in the first region 10, and gate structures 200 and 300 are respectively formed on the substrate 8 in the second region 20 and the third region 30. There are gaps 110a and 110b among the stacked gates 100, and a width W4 of the gap 110b is greater than a width W3 of the gap 110a.

In an embodiment, each of the stacked gates 100 includes, from bottom to top, a tunneling dielectric layer 102, a floating gate 104, an inter-dielectric layer 106, and a control gate 108. The tunneling dielectric layer 102 is made of silicon oxide, for example. The floating gate 104 and the control gate 108 are made of doped polysilicon, for example. The inter-gate dielectric layer 106 is made of silicon oxide or have a silicon oxide/silicon nitride/silicon oxide stacked structure, for example. The gate structure 200 includes, from bottom to top, a gate dielectric layer 202 and a gate 204. The gate structure 300 includes, from bottom to top, a gate dielectric layer 302 and a gate 304. The gate dielectric layers 202 and 302 are made of silicon oxide, silicon nitride, or a high-k material with a dielectric constant greater than 4, for example. The gates 204 and 304 are, for example, made of doped polysilicon.

Next, doped regions 112a and 112b are formed in the substrate 8 exposed by the gaps 110a and 110b among the stacked gates 100 in the first region 10. The doped region 112a is, for example, a source region, and the doped region 110b is, for example, a drain region. Extended source or drain regions 212 are formed in the substrate 8 at respective sides of the gate structure 200 in the second region 20. Extended source or drain regions 312 are formed in the substrate 8 at respective sides of the gate structure 300 in the third region 30. A method of forming the doped regions 112a and 112b, the extended source or drain regions 212, and the extended source or drain regions 312 is, for example, an ion implantation method.

In an embodiment, the width W4 of the gap 110b is smaller than about 0.3 µm, eapecitally smaller than about 0.2 µm, the thickness H of the stacked gates 100 is about 3200 angstroms and the aspect ratio of the gap 110a is more than 1.07. The gap 110a cannot be completely filled with a dielectric layer if the dielectric layer is directly formed over the substrate 8, and pipes or seams are then formed therein. Therefore, in the embodiment, instead of the step of directly forming the dielectric layer, the following steps are conducted.

A liner 114 is formed at sidewalls of the stacked gates 100 and the gate structures 200 and 300. The liner 114 can have a single-layered structure, a double-layered structure, or a multi-layered structure formed by silicon oxide or/and silicon nitride. In an embodiment, the liner 114 has a double-layered structure composed of a silicon oxide layer and a silicon nitride layer, and the liner 114 is, for example, formed by performing a thermal oxidation process or a chemical vapor deposition (CVD) process, such that conformal silicon oxide layer and conformal silicon nitride layer are formed in sequence. Thereafter, a spacer material layer 116 is formed on the substrate 8 in the first region 10, the second region 20, and the third region 30. The spacer material layer 116 is made of silicon oxide or silicon nitride, for example, and the spacer material layer 116 is formed by performing a CVD process, for example.

Figure 1B:
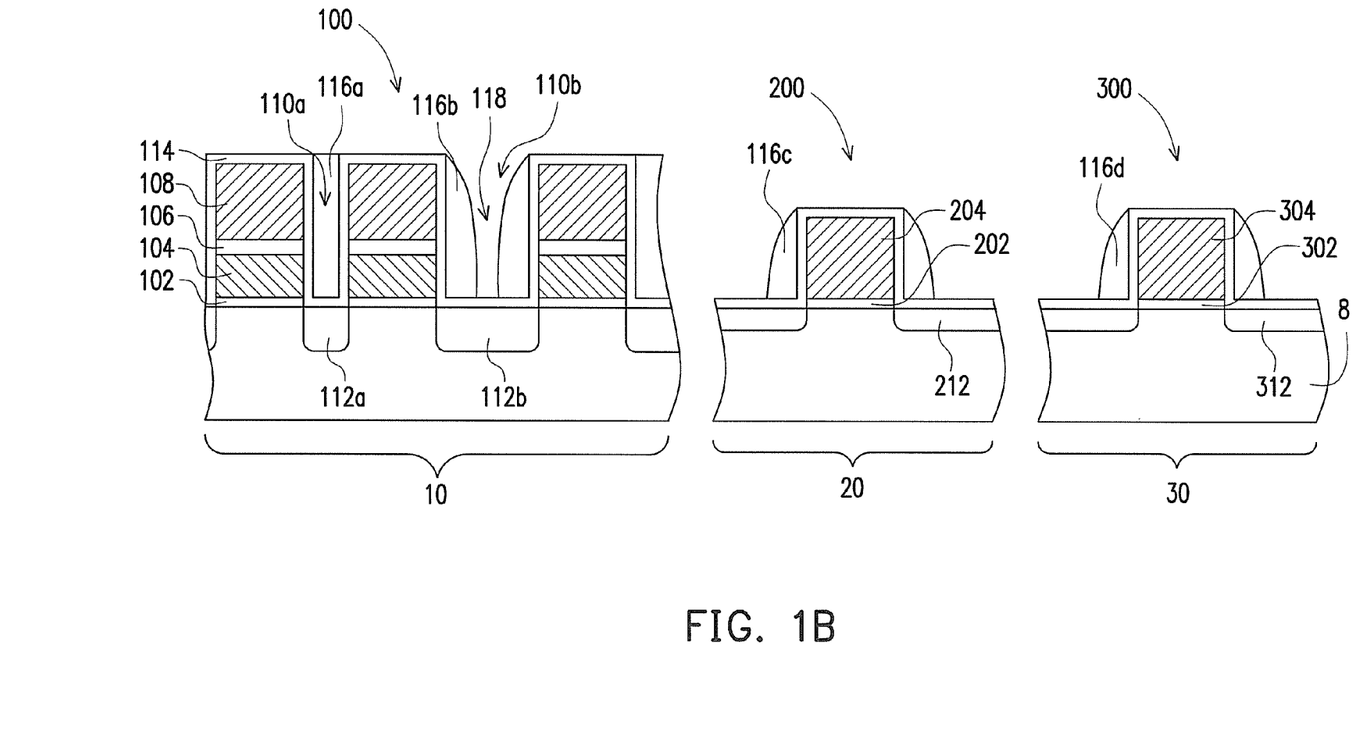

Referring to FIG. 1B, an anisotropic etching process is implemented to remove the spacer material layer 116 covering top surfaces of the stacked gates 100 and the gate structures 200 and 300. A spacer material layer 116a in the gap 110a is left, and spacers 116b, 116c, and 116d are respectively formed at sidewalls of the stacked gates 100 in the gap 110a, sidewalls of the gate structure 200, and sidewalls of the gate structure 300. Two of the spacers 116b formed in the gap 110b are disposed in an interval, such that a pipe or a seam 118 is formed.

Figure 1C:
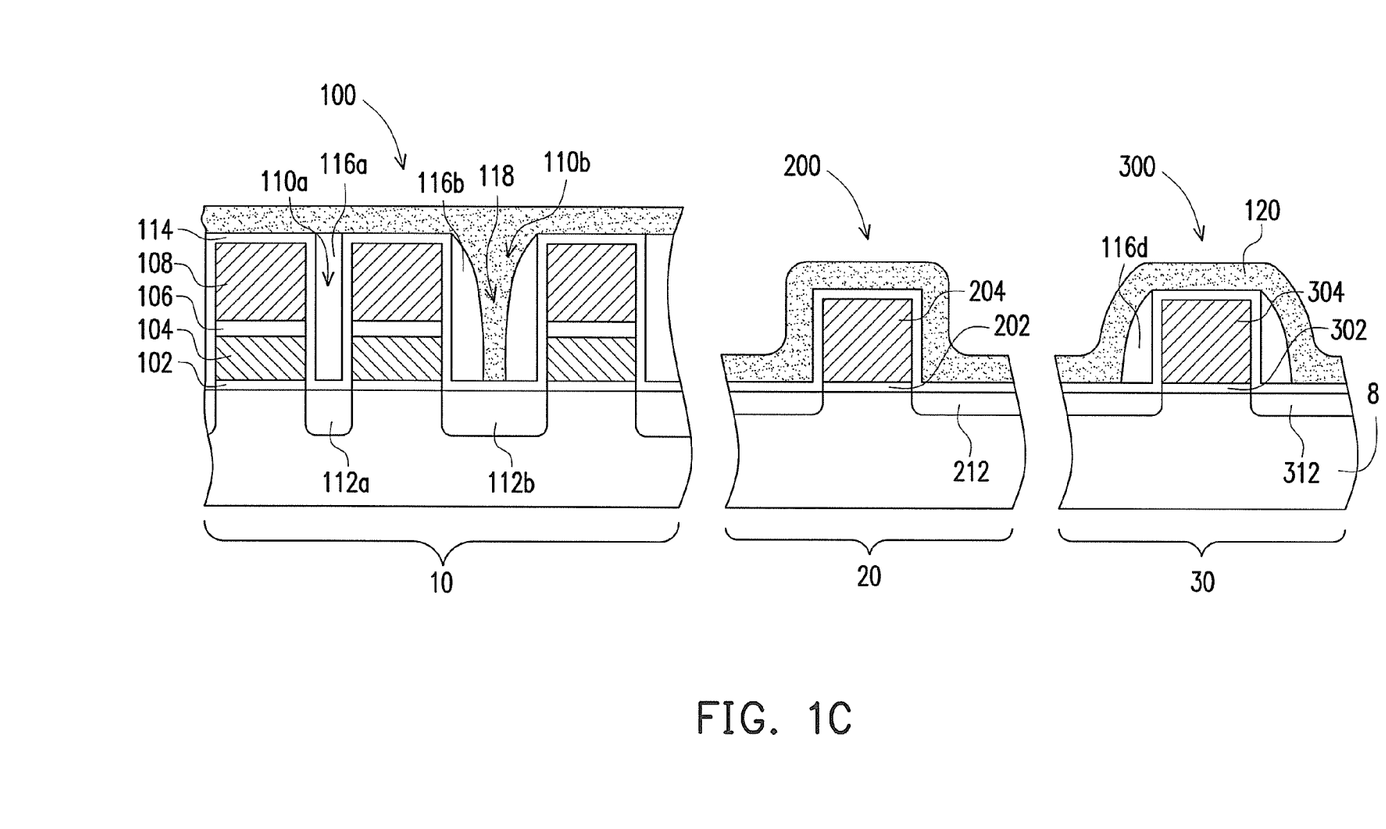

After that, as indicated in FIG. 1C, the spacers 116c located at the sidewalls of the gate structure 200 in the second region 20 are removed. The removal of the spacers 116c is conducted by, for example, forming a photoresist layer (not shown) on the substrate 8. Here, the photoresist layer has an opening exposing the second region 20. Next, a wet etching process is performed to remove the spacers 110c exposed by the opening. The photoresist layer is then removed.

Thereafter, an insulating layer 120 is formed on the substrate 8 in the first region 10, the second region 20, and the third region 30. Owing to the satisfactory gap-filling ability of the insulating layer 120, the pipe or the seam 118 can be completely filled with the insulating layer 120. The insulating layer 120 is made of silicon oxide or silicon nitride, for example, and is formed by performing a CVD process, for example. The material of the insulating layer 120 can be the same as or different from the material of the spacer material layer 116.

Figure 1D:
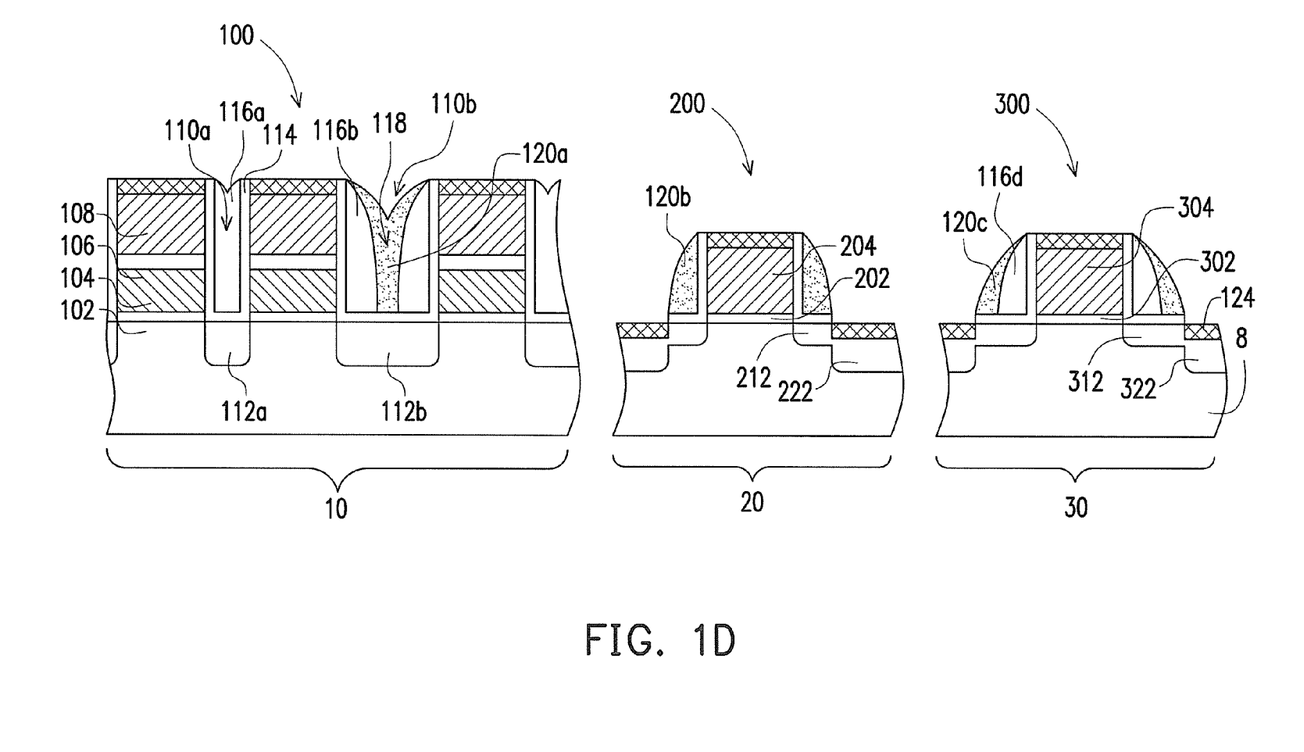

Afterwards, as shown in FIG. 1D, an anisotropic etching process is performed to remove the insulating layer 120 covering the stacked gates 100 and the gate structures 200 and 300, while an insulating layer 120a in the pipe or the seam 118 is left. Besides, spacers 120b are formed at the sidewalls of the gate structure 200b, and spacers 120c are formed around the spacers 116d at the sidewalls of the gate structure 300. The etching process continues to be performed for removing the liner 114 which is not covered by the spacers 120b and 120c and the insulating layer 120a so as to expose the stacked gates 100, the gate structures 200 and 300, and a surface of the substrate 8 in the second region 20 and the third region 30. An ion implantation process is then performed on the second region 20 and the third region 30, such that the source or drain regions 222 and 322 are formed in the substrate 8 of the second region 20 and the third region 30. Next, a self-aligned silicidation process is implemented to form self-aligned silicide 124 on the stacked gates 100, the gate structures 200 and 300, and the source or drain regions 222 and 322. The self-aligned silicide 124 is, for example, made of cobalt silicide or nickel silicide. The doped regions 112a and 112b in the first region 10 are not exposed, and therefore the self-aligned silicide 124 is not formed. An area of the self-aligned silicide 124 is substantially equivalent to an area of the source or drain regions 222 and 322.

Figure 1E:
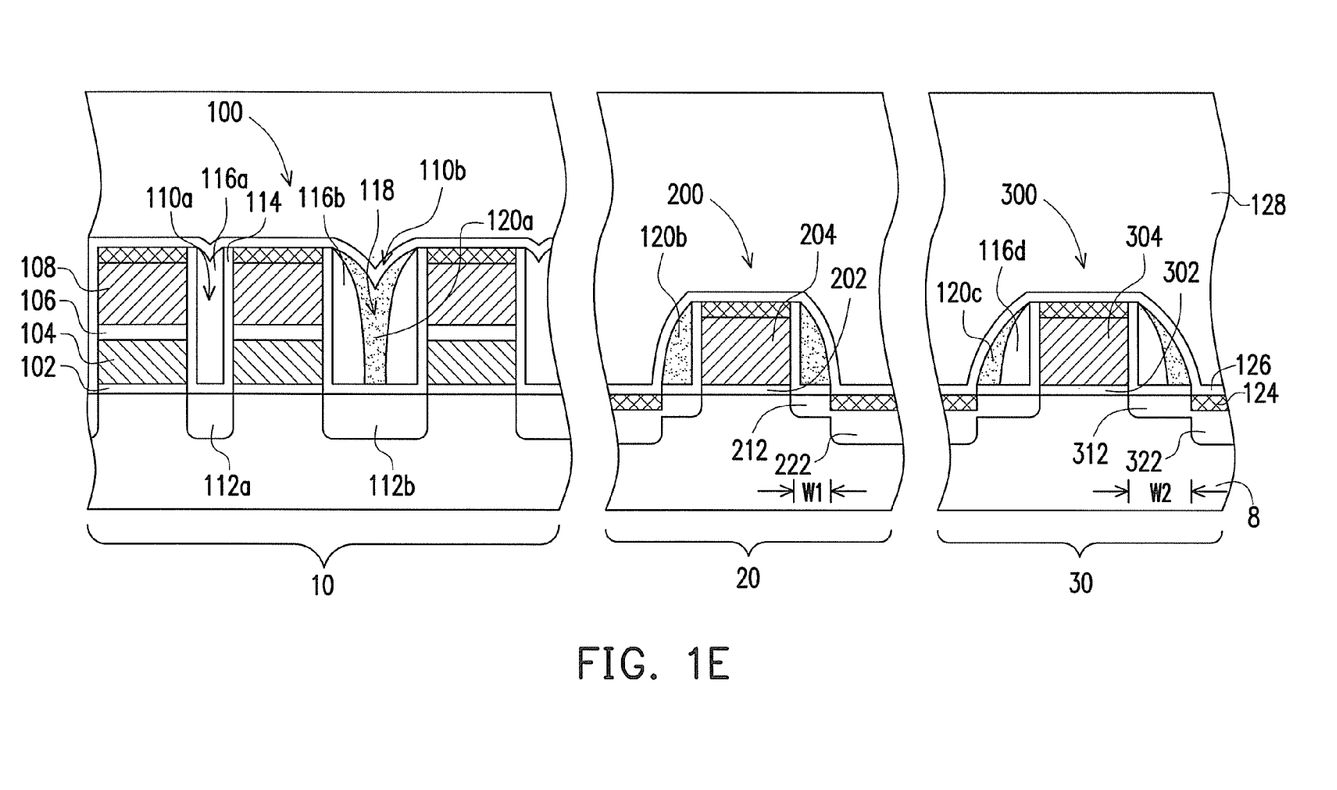

After that, as indicated in FIG. 1E, an etching stop layer 126 is formed over the substrate 8. The etching stop layer 126 is made of silicon nitride, for example, and the etching stop layer 126 is formed by performing a CVD process, for example. Thereafter, a dielectric layer 128 is formed on the etching stop layer 126. The dielectric layer 128 is made of silicon nitride, phosphorus silicon glass (PSG), boron phosphorous silicon glass (BPSG), or undoped silicon glass (USG), for example, and the dielectric layer 128 is formed by performing a CVD process, for example.

Figure 1F:
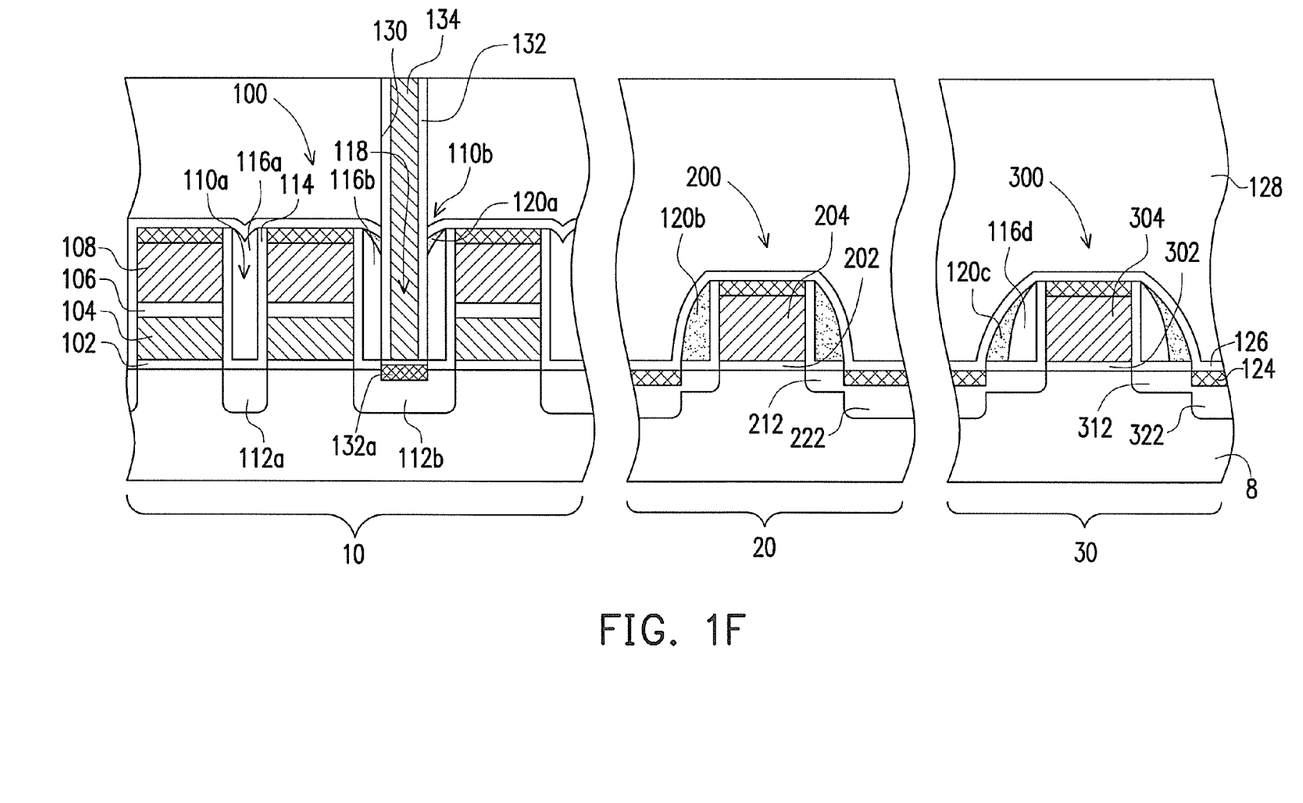

As indicated in FIG. 1F, a photoresist layer (not shown) is then formed on the dielectric layer 128. The photoresist layer has an opening corresponding to the doped region 112b. Next, an etching process is implemented to remove the dielectric layer 128 exposed by the opening, and the etching stop layer 126, the insulating layer 120a, the spacers 116b, and the liner 114 under the dielectric layer 128 are also removed. Thereby, a contact opening 130 exposing the doped region 112b is formed. A barrier layer 132 is then formed in the contact opening 130. The barrier layer 132 is, for example, formed by titanium, tantalum, or a combination of titanium nitride or tantalum nitride together with titanium and tantalum. Thereafter, a thermal annealing process is implemented, such that metal in the barrier layer 132 reacts with silicon in the doped region 112b. As such, a silicide layer 132a is formed, and sheet resistance is reduced. The silicide layer 132a and the self-aligned silicide 124 can be made of the same material or different materials. For instance, the silicide layer 132a is made of titanium silicide or tantalum silicide. Since the dimension of the contact opening 130 is smaller than the dimension of the doped region 112b, and the silicide layer 132a is merely formed at the bottom of the contact opening 130, an area of the silicide layer 132a is smaller than an area of the doped region 112b. Namely, the silicide layer 132a is formed on a part of the surface of the doped region 112b corresponding to the contact opening 130 but is not formed on the other part of the surface of the doped region 112b which is not corresponding to the contact opening 130. The contact opening 130 is then filled with a metal layer to form a contact window 134 electrically connected to the doped region 112b. The metal layer herein is made of tungsten or doped polysilicon, for example.

As indicated in FIG. 1E, the semiconductor device of the present embodiment consistent with the present invention is formed on the substrate 8. The substrate 8 includes the first region 10, the second region 20, and the third region 30.

The first region 10 is, for instance, a memory cell region. A memory device on the first region 10 includes the plurality of stacked gates 100 and doped regions 112a and 112b. Each of the stacked gates 100 includes, from bottom to top, the tunneling dielectric layer 102, the floating gate 104, the inter-dielectric layer 106, and the control gate 108. The self-aligned silicide 124 is formed on the control gate 108. There are the gaps 110a and 110b with different dimensions among the stacked gates 100. The doped region 112a is located in the substrate 8 under the gap 110a with a smaller width, while the doped region 112b is located in the substrate 8 under the gap 110b with a larger width. The liner 114 is formed at sidewalls of the stacked gates 100 in the gap 110a, while the rest of the gap 110a is filled with a spacer material layer 116a. Spacers 116b are formed at sidewalls of the stacked gates 100 in the gap 110b, the liner 114 is formed between the spacers 116b and the stacked gates 100, and the pipe or the seam between the spacers 116b is filled with the insulating layer 120a.

The second region 20 is, for example, a first logic circuit region. There is a low voltage device, e.g. a MOS transistor, on the second region 20, and the low voltage device includes the gate structure 200, the liner 114, and the spacers 120b. The gate structure 200 includes the gate dielectric layer 202 and the gate 204. The spacers 120b are disposed at the sidewalls of the gate structure 200. The liner 114 is located between the spacers 120b and the gate structure 200 and between the spacers 120b and the substrate 8. Extended source or drain regions 212 and source or drain regions 222 are located in the substrate 8 at respective sides of the gate structure 200. In addition, the self-aligned silicide 124 can also be formed on the gate 204 and the source or drain regions 222.

The third region 30 is, for example, a second logic circuit region. There is a high voltage device, e.g. a MOS transistor, on the third region 30, and the high voltage device includes the gate structure 300, the extended source or drain regions 312, the source or drain regions 322, and the spacers 116d and 120c. The gate structure 300 includes the gate dielectric layer 302 and the gate 304. The spacers 116d and 120c are disposed at the sidewalls of the gate structure 300. The liner 114 is located between the spacers 116d and the gate structure 300 and between the spacers 116d and 120c and the substrate 8. The extended source or drain regions 312 and the source or drain regions 322 are located in the substrate 8 at respective sides of the gate structure 300. In addition, the self-aligned silicide 124 can also be formed on the gate 304 and the source or drain regions 322. After the spacers 116d and 120c are combined, the width of the combined spacers 116d and 120c is greater than the width of the spacers 120b. The width W2 of the extended source or drain regions 312 is greater than the width W1 of the extended source or drain regions 212.

The first region 10, the second region 20, and the third region 30 are covered by the etching stop layer 126 and the dielectric layer 128.

Additionally, as indicated in FIG. 1F, the contact window 134 is formed in the dielectric layer 128 and the etching stop layer 126, the insulating layer 120a, the spacers 116b, and the liner 114 under the dielectric layer 128 in the first region 10. The contact window 134 is electrically connected to the doped region 112b. A silicide layer 132a can be disposed between the contact window 134 and the doped region 112b. The area of the silicide layer 132a is smaller than the area of the doped region 112b.

According to the embodiments of the present invention, the pipe or the seam between the spacers is filled with the insulating layer having a gap-filling ability greater than that of the dielectric layer. Hence, the present invention is capable of being applied to devices with relatively small pitches. Moreover, the issue that the pipe or the seam cannot be filled with the dielectric layer having a relatively unfavorable gap-filling ability can be resolved in the present invention, and metal deposited in the subsequent process of forming the contact window can be prevented from filling up the pipe or the seam. As such, the short circuit between adjacent contact windows can also be precluded.

Furthermore, the process of forming the insulating layer in the pipe or the seam between the spacers can be integrated with the process of forming the spacers in the logic circuit regions, thus giving rise to simplification of the overall fabrication.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor device, comprising:
    a plurality of stacked gates located on a substrate, wherein there are a first gap and a second gap among the stacked gates, and a dimension of the first gap is smaller than a dimension of the second gap, wherein each of the stacked gates further comprises a self-aligned silicide layer;
    a first doped region located in the substrate under the first gap;
    a second doped region located in the substrate under the second gap;
    a spacer material layer located in the first gap;
    two first spacers located at sidewalls of the stacked gates in the second gap, wherein there is a pipe or a seam between the first spacers, and a material of the first spacers and a material of the spacer material layer are the same;
    an insulating layer filled up the pipe or the seam, wherein the first spacers and the insulating layer do not cover the plurality of stacked gates;
    a dielectric layer located on the substrate and covering the insulating layer and the stacked gates;
    a contact window located in the dielectric layer, the insulating layer, and the first spacers in the second gap, wherein the contact window is electrically connected to the second doped region; and
    a silicide layer located merely between the contact window and the second doped region, wherein a material of the self-aligned silicide layer is different from a material of the silicide layer.

2. The semiconductor device as claimed in claim 1, wherein the contact window directly contacts the second doped region.

3. The semiconductor device as claimed in claim 1, wherein the self-aligned silicide layer is not formed on the first doped region and the second doped region.

4. The semiconductor device as claimed in claim 1, wherein each of the stacked gates comprises:
    a floating gate located over the substrate;
    a tunneling dielectric layer located between the floating gate and the substrate;
    a control gate located on the floating gate; and
    an inter-gate dielectric layer located between the control gate and the floating gate.

5. The semiconductor device as claimed in claim 1, the substrate comprising a memory cell region and a first logic circuit region, wherein the stacked gates are located in the memory cell region, and the semiconductor device further comprises:
    a first transistor located on the first logic circuit region;
    two second spacers located at sidewalls of a first gate of the first transistor, wherein a material of the second spacers and a material of the insulating layer are the same.

6. The semiconductor device as claimed in claim 5, wherein the first transistor further comprises:
- two first extended source or drain regions located in the substrate under the second spacers;
- two first source or drain regions located in the substrate and electrically connected to the first extended source or drain regions; and
- a plurality of self-aligned silicide layers located on the first gate and the first source or drain regions of the first transistor.

7. The semiconductor device as claimed in claim 5, wherein the substrate further comprises a second logic circuit region, and the semiconductor device further comprises:
- a second transistor located on the second logic circuit region;
- two third spacers located at sidewalls of a second gate of the second transistor, wherein a material of the third spacers and the material of the spacer material layer are the same; and
- two fourth spacers surrounding the third spacers, wherein a material of the fourth spacers and the material of the insulating layer are the same.

8. The semiconductor device as claimed in claim 7, the first transistor comprising two first extended source or drain regions located in the substrate under the second spacers; and
the second transistor comprising two second extended source or drain regions located in the substrate under the third spacers and the fourth spacers,
wherein a width of the second extended source or drain regions is greater than a width of the first extended source or drain regions.

9. The semiconductor device as claimed in claim 8, further comprising:
- a plurality of first self-aligned silicide layers located on the first gate and the first source or drain regions of the first transistor; and
- a plurality of second self-aligned silicide layers located on the second gate and the second source or drain regions of the second transistor.

10. The semiconductor device as claimed in claim 1, wherein the substrate comprises a memory cell region and a logic circuit region, the stacked gates are located in the memory cell region and the semiconductor device further comprises:
- a transistor located on the logic circuit region;
- two second spacers located at sidewalls of a gate of the transistor, wherein a material of the second spacers and the material of the spacer material layer are the same; and
- two third spacers surrounding the second spacers of the transistor, wherein a material of the third spacers and a material of the insulating layer are the same.

11. The semiconductor device as claimed in claim 10, wherein the transistor comprises:
- two extended source or drain regions located in the substrate under the second spacers and the third spacers;
- two source or drain regions located in the substrate and electrically connected to the extended source or drain regions; and
- a plurality of self-aligned silicide layers located on the gate and the source or drain regions of the transistor.

12. The semiconductor device as claimed in claim 1, further comprising an etching stop layer located between the dielectric layer and the substrate, the stacked gates, and the insulating layer.

13. The semiconductor device as claimed in claim 1, further comprising a liner located between the stacked gates and the spacer material layer and between the stacked gates and the first spacers.

14. A memory device, comprising:
- two stacked gates located on a substrate, wherein there is a gap between the stacked gates, wherein each of the stacked gates comprises:
  - a floating gate located over the substrate;
  - a tunneling dielectric layer located between the floating gate and the substrate;
  - a control gate located on the floating gate; and
  - an inter-gate dielectric layer located between the control gate and the floating gate;
- two spacers respectively located at sidewalls of each of the stacked gates in the gap, wherein there is a pipe or a seam between the spacers;
- an insulating layer filled up the pipe or the seam, wherein the two spacers and the insulating layer do not cover the two stacked gates;
- a doped region in the substrate under the spacers and the insulating layer;
- a dielectric layer located on the substrate and covering the insulating layer and the stacked gates;
- a contact window located in the dielectric layer, the insulating layer, and the spacers in the gap, wherein the contact window is electrically connected to the doped region;
- a silicide layer located merely between the contact window and the doped region, and a material of the self-aligned silicide layer is different from a material of the silicide layer.

15. The memory device as claimed in claim 14, wherein each of the stacked gates further comprises a self-aligned silicide layer located on the control gate, and the self-aligned silicide layer not formed on a surface of the substrate between the stacked gates.

16. The memory device as claimed in claim 14, wherein the contact window directly contacts the doped region.

* * * * *